US012648290B2

(12) United States Patent
Lee et al.

(10) Patent No.: US 12,648,290 B2
(45) Date of Patent: Jun. 2, 2026

(54) ORGANIC LIGHT EMITTING DISPLAY DEVICE

(71) Applicant: LG Display Co., Ltd., Seoul (KR)

(72) Inventors: Sang-Bin Lee, Paju-si (KR); Tae-Kung Ryoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 455 days.

(21) Appl. No.: 18/465,023

(22) Filed: Sep. 11, 2023

(65) Prior Publication Data

US 2024/0224557 A1 Jul. 4, 2024

(30) Foreign Application Priority Data

Dec. 29, 2022 (KR) ........................ 10-2022-0189904

(51) Int. Cl.
H10K 50/11 (2023.01)
H10K 59/122 (2023.01)
H10K 59/80 (2023.01)

(52) U.S. Cl.
CPC ........... H10K 50/11 (2023.02); H10K 59/122 (2023.02); H10K 59/80518 (2023.02)

(58) Field of Classification Search
CPC .............................. H10K 59/122; H10K 50/11

USPC .................................................. 313/498–512
See application file for complete search history.

(56) References Cited

U.S. PATENT DOCUMENTS

| | | | |
|---|---|---|---|
| 2022/0262878 A1* | 8/2022 | Lee ...................... | H10K 59/122 |
| 2023/0209859 A1* | 6/2023 | Seo ..................... | H10K 85/6572 257/40 |
| 2023/0209910 A1* | 6/2023 | Park ................... | H10K 59/8723 257/40 |
| 2024/0206234 A1* | 6/2024 | Guo ..................... | H10K 59/124 |
| 2025/0204203 A1* | 6/2025 | Lee ...................... | H10K 59/123 |
| 2025/0234719 A1* | 7/2025 | Kim ....................... | H10K 59/35 |

* cited by examiner

*Primary Examiner* — Christopher M Raabe
(74) *Attorney, Agent, or Firm* — Fenwick & West LLP

(57) ABSTRACT

The present disclosure relates to an organic light emitting display device comprising a first substrate including a first pixel, the first pixel including first and second regions; a first electrode in the first region and on the first substrate, the first electrode having a first work function value; a second electrode in the second region and on the first substrate, the second electrode having a second work function value smaller than the first work function value; a first organic light emitting layer on the first electrode; a second organic light emitting layer on the second electrode; and a p-type charge generation layer in the first and second regions and on the first and second organic light emitting layers.

20 Claims, 9 Drawing Sheets

100

100

ORGANIC LIGHT EMITTING DISPLAY DEVICE

CROSS-REFERENCE TO RELATED APPLICATIONS

The present application claims the benefit of Republic of Korea Patent Application No. 10-2022-0189904 filed in the Republic of Korea on Dec. 29, 2022, which is hereby incorporated by reference in its entirety.

FIELD OF TECHNOLOGY

The present disclosure relates to an organic light emitting display device, and more specifically, to an organic light emitting display device having a tandem structure with improved light extraction efficiency.

BACKGROUND

An organic light emitting display device as one of new flat panel display devices is a self-emission type. The organic light emitting display device has excellent properties in a viewing angle and a contrast ratio in comparison to a liquid crystal display device. In addition, since a backlight unit is not required in the organic light emitting display device, the organic light emitting display device has a thin profile and low power consumption.

The organic light emitting display device includes an organic light emitting diode (OLED), and the OLED includes a first electrode, a second electrode and an organic light emitting layer therebetween.

For example, in the OLED, the light from the organic light emitting layer passes through the second electrode to display an image. However, since there is a big difference in a refractive index between the organic light emitting layer of an organic material and the second electrode of a conductive material, e.g., a metal or a transparent conductive oxide material, a total reflection occurs at an interface between the organic light emitting layer and the second electrode.

Accordingly, the light from the organic light emitting layer is toward a lateral side so that the light extraction efficiency of the organic light emitting display device including the OLED is decreased.

SUMMARY

The present disclosure is directed to an organic light emitting display device that substantially obviates one or more of the problems associated with the limitations and disadvantages of the related conventional art.

An object of the present disclosure is to provide an organic light emitting display device having a tandem structure with improved light extraction efficiency.

Additional features and advantages of the present disclosure are set forth in the description which follows, and will be apparent from the description, or evident by practice of the present disclosure. The objectives and other advantages of the present disclosure are realized and attained by the features described herein as well as in the appended drawings.

To achieve these and other advantages in accordance with the purpose of the embodiments of the present disclosure, as described herein, an aspect of the present disclosure is an organic light emitting display device comprising a first substrate including a first pixel, the first pixel including first and second regions; a first electrode in the first region and on the first substrate, the first electrode having a first work function value; a second electrode in the second region and on the first substrate, the second electrode having a second work function value smaller than the first work function value; a first organic light emitting layer on the first electrode; a second organic light emitting layer on the second electrode; and a p-type charge generation layer in the first and second regions and on the first and second organic light emitting layers.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this specification, illustrate embodiments of the present disclosure and together with the description serve to explain the principles of the present disclosure.

DETAILED DESCRIPTION

Figure 1:
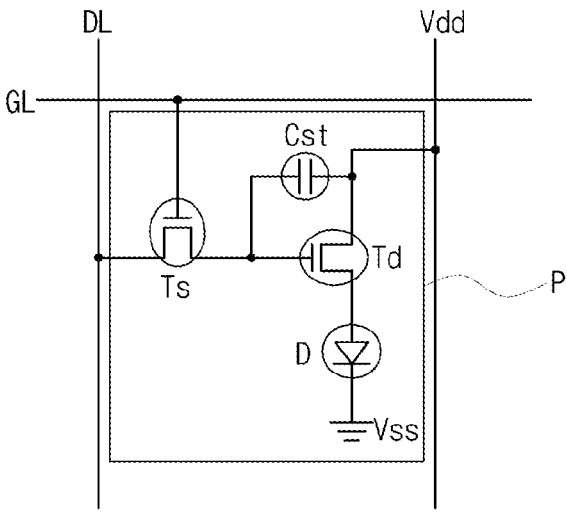
FIG. 1 is a schematic circuit diagram illustrating an organic light emitting display device according to an embodiment of the present disclosure.

Reference will now be made in detail to aspects of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure and methods of achieving them will be apparent with reference to the aspects described below in detail with the accompanying drawings. However, the present disclosure is not limited to the aspects disclosed below, but can be realized in a variety of different forms, and only these aspects allow the disclosure of the present disclosure to be complete. The present disclosure is provided to fully inform the scope of the disclosure to the skilled in the art of the present disclosure.

The shapes, sizes, proportions, angles, numbers, and the like disclosed in the drawings for explaining the aspects of the present disclosure are illustrative, and the present disclosure is not limited to the illustrated matters. The same reference numerals refer to the same elements throughout the specification. In addition, in describing the present disclosure, if it is determined that a detailed description of the related known technology unnecessarily obscure the subject matter of the present disclosure, the detailed description thereof can be omitted. When 'including', 'having', comprising, and the like are used in this specification, other parts may be added unless 'only' is used. When a component is expressed in the singular, cases including the plural are included unless specific statement is described.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Reference will now be made in detail to some of the examples and preferred embodiments, which are illustrated in the accompanying drawings.

FIG. 1 is a schematic circuit diagram illustrating an organic light emitting display device of the present disclosure.

As illustrated in FIG. 1, a gate line GL and a data line DL, which cross each other to define a pixel (pixel region) P, a low potential voltage line Vss and a high low potential voltage line Vdd are formed. In the pixel P, a switching thin film transistor (TFT) Ts, a driving TFT Td, a storage capacitor Cst and an OLED D are formed.

The switching TFT Ts is connected to the gate line GL and the data line DL, and the driving TFT Td and the storage capacitor Cst are connected between the switching TFT Ts and the high low potential voltage line Vdd. The OLED D is connected to the driving TFT Td, the high low potential voltage line Vdd and the low potential voltage line Vss.

When the switching TFT Ts is turned on by the gate signal applied through the gate line GL, the data signal applied through the data line DL is applied to a gate electrode of the driving TFT Td and one electrode of the storage capacitor Cst through the switching TFT Ts.

The driving TFT Td is turned on by the data signal applied into the gate electrode so that a current proportional to the data signal is supplied from the high low potential voltage line Vdd to the OLED D through the driving TFT Td. The OLED D emits light having a luminance proportional to the current flowing through the driving TFT Td.

In this case, the storage capacitor Cst is charged with a voltage proportional to the data signal so that the voltage of the gate electrode in the driving thin film transistor Td is kept constant during one frame.

Therefore, the organic light emitting display device can display a desired image.

Figure 2:
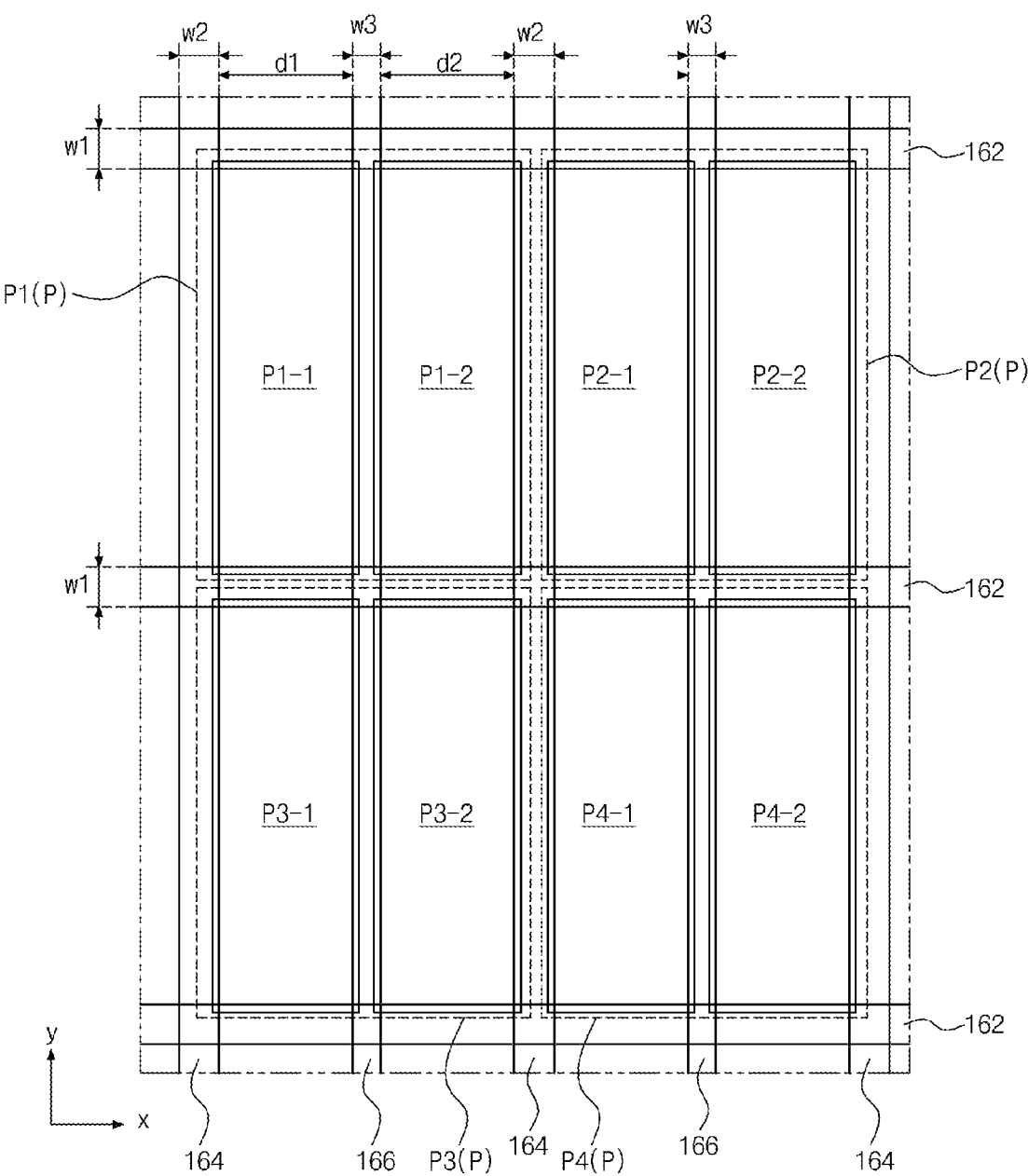
FIG. 2 is a schematic plan view showing a pixel arrangement configuration of an organic light emitting display device according to a first embodiment of the present disclosure.

FIG. 2 is a schematic plan view showing a pixel arrangement configuration of an organic light emitting display device according to a first embodiment of the present disclosure.

As shown in FIG. 2, the organic light emitting display device includes a first bank 162, which extends along a first direction "x" and is spaced apart from each other in a second direction "y" crossing the first direction "x", a second bank 164, which extends along the second direction "y" and is spaced apart from each other in the first direction "x", and a third bank 166, which extends along the second direction "y" and is positioned between the second banks 164.

The first and second banks 162 and 164 cross each other to define the pixel P. A first pixel P1 and a second pixel P2, which are arranged along the first direction "x", are pixels with different colors, and a third pixel P3 and a fourth pixel P4, which are arranged along the first direction "x", are pixels with different colors. The first pixel P1 and the third pixel P3, which are arranged along the second direction "y", are pixels with the same color, and the second pixel P2 and the fourth pixel P4, which are arranged along the second direction "y", are pixels with the same color.

The third bank 166 runs across the pixel P so that the pixel P is divided into two regions by the third bank 166. Namely, the first pixel P1 is divided into a first region P1-1 and a second region P1-2 by the third bank 166, and the second pixel P2 is divided into a first region P2-1 and a second region P2-2 by the third bank 166. In addition, the third pixel P3 is divided into a first region P3-1 and a second region P3-2 by the third bank 166, and the fourth pixel P4 is divided into a first region P4-1 and a second region P4-2 by the third bank 166.

In other words, the first bank 162 extends along the first direction "x" and is disposed at a first edge of the pixel P. The second bank 164 extends along the second direction "y"

and is disposed at a second edge of the pixel P. The third bank 166 extends along the second direction "y" and is disposed between the first and second regions.

A first OLED including a first electrode 210 as an anode is disposed in each of the first regions P1-1, P2-1, P3-1 and P4-1, and a second OLED including a second electrode 220 as a cathode is disposed in each of the second regions P1-2, P2-2, P3-2 and P4-2.

However, an arrangement of the first and second OLEDs is not limited thereto.

In some embodiments of the present disclosure, the first OLED and the second OLED may be disposed in the first region P1-1 and the second region P1-2 in the first pixel P1, respectively, and the second OLED and the first OLED may be disposed in the first region P2-1 and the second region P2-2 in the second pixel P2, respectively. In this case, the second electrode 220 in the second region P1-2 of the first pixel P1 and the second electrode 220 in the first region P2-1 of the second pixel P2 may be formed as one-body.

In addition, in some embodiments of the present disclosure, the first OLED may be disposed in each of the first region P1-1 of the first pixel P1, the second region P2-2 of the second pixel P2, the first region P3-1 of the third pixel P3 and the second region P4-2 of the fourth pixel P4, and the second OLED may be disposed in each of the second region P1-2 of the first pixel P1, the first region P2-1 of the second pixel P2, the second region P3-2 of the third pixel P3 and the first region P4-1 of the fourth pixel P4. In this case, the second electrode 220 in the second region P1-2 of the first pixel P1, the second electrode 220 in the first region P2-1 of the second pixel P2, the second electrode 220 in the second region P3-2 of the third pixel P3 and the second electrode 220 in the first region P4-1 of the fourth pixel P4 may be formed as one-body.

The first bank 162 may have a hydrophilic property. As described above, since the adjacent pixels in the second direction "y", the organic light emitting layer in the adjacent regions in the second direction "y" may be connected to each other when the organic light emitting layer of each of the first and second OLEDs is formed by a solution process.

Each of the second and third banks 164 and 166 may have a hydrophobic property. Accordingly, when the organic light emitting layer of each of the first and second OLEDs is formed by a solution process, an overflow of an ink for forming the organic light emitting layer in adjacent pixels or adjacent regions can be prevented or at least reduced.

The first bank 162 has a first thickness, and each of the second and third banks 164 and 166 has a second thickness, which may be greater than the first thickness.

In each of the first regions P1-1 to P4-1, the second and third banks 164 and 166 are spaced apart from each other by a first distance d1. In each of the second regions P1-2 to P4-2, the second and third banks 164 and 166 are spaced apart from each other by a second distance d2, which may be substantially same as the first distance d1. Namely, the first regions P1-1 to P4-1 may have substantially same width and area as the second regions P1-2 to P4-2, respectively, in a plan view.

The first bank 162 disposed between adjacent pixels in the second direction "y" has a first width w1, the second bank 164 disposed between adjacent pixels in the first direction "x" has a second width w2, and the third bank 166 disposed between adjacent regions of each pixel has a third width w3. The third width w3 is smaller than each of the first and second widths w1 and w2. The first and second widths w1 and w2 may be same or different.

Figure 3:
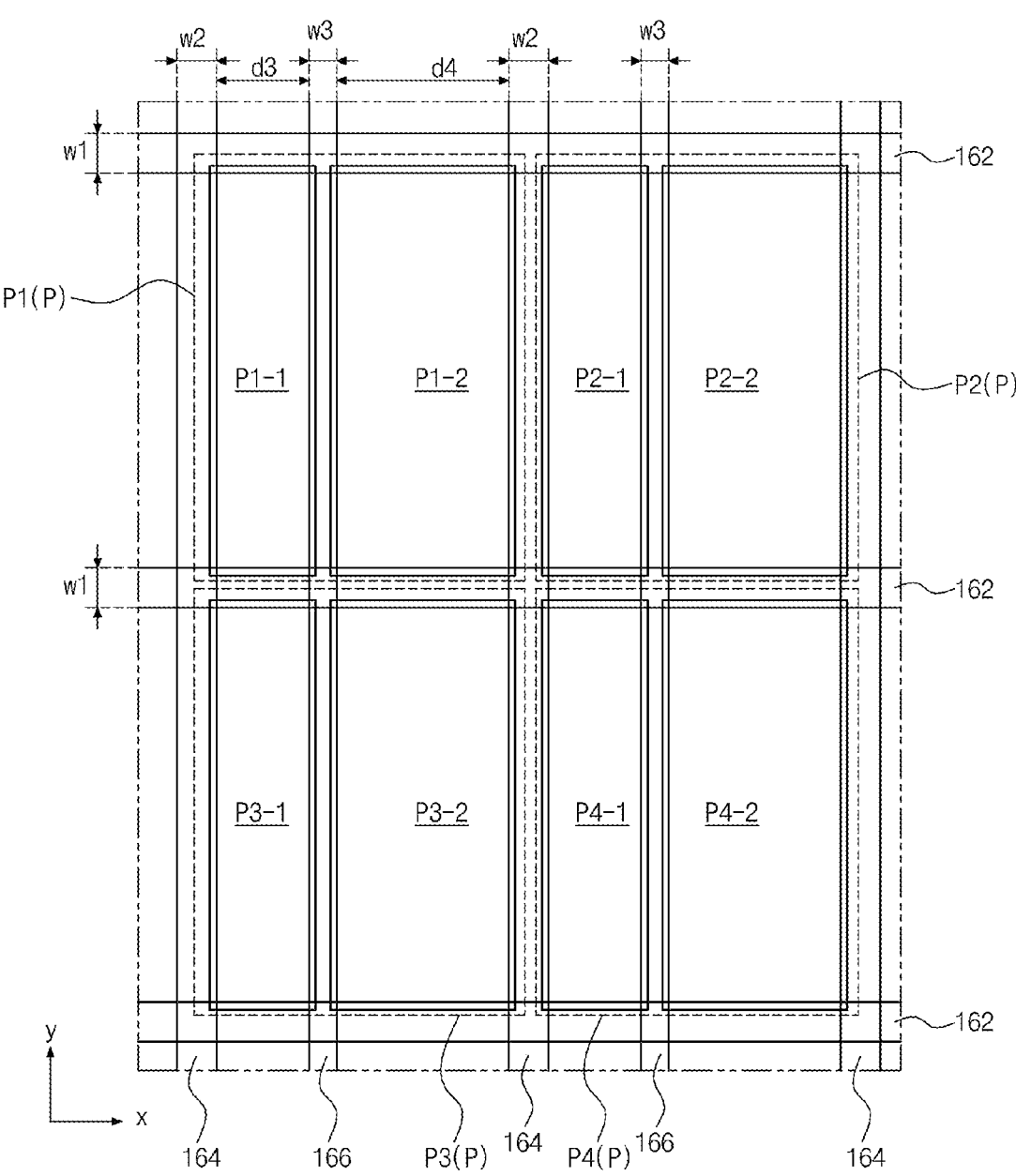
FIG. 3 is a schematic plan view showing a pixel arrangement configuration of an organic light emitting display device according to a second embodiment of the present disclosure.

FIG. 3 is a schematic plan view showing a pixel arrangement configuration of an organic light emitting display device according to a second embodiment of the present disclosure.

The pixel arrangement configuration of an organic light emitting display device in FIG. 3 and the pixel arrangement configuration of an organic light emitting display device in FIG. 2 have a difference in a width of the first and second regions.

Namely, in the organic light emitting display device in FIG. 2, the first distance d1 between the second and third banks 164 and 166 in each of the first regions P1-1 to P4-1 and the second distance d2 between the second and third banks 164 and 166 in each of the second regions P2-1 to P4-1 are substantially same. In other words, the first regions P1-1 to P4-1 and the second regions P1-2 to P4-1 have substantially the same width, respectively.

In the organic light emitting display device in FIG. 3, the second and third banks 164 and 166 in each of the first regions P1-1 to P4-1 are spaced apart from each other by a third distance d3, and the second and third banks 164 and 166 in each of the second regions P1-2 to P4-2 are spaced apart from each other by a fourth distance d4 being greater than the third distance d3. In other words, the second regions P1-2 to P4-2 have a width greater than the first regions P1-1 to P4-1, respectively, and the second regions P1-2 to P4-2 have an area greater than the first regions P1-1 to P4-1, respectively, in a plan view.

The first OLED in each of the first regions P1-1 to P4-1 has a normal structure, and the second OLED in each of the second regions P1-2 to P4-2 has an inverted structure. A distance between an emitting material layer (EML) and the second electrode in the second OLED is smaller than that between the EML and the second electrode in the first OLED so that the emitting efficiency of the second OLED in the second region may be decreased by a plasmon effect. In the organic light emitting display device of the present disclosure, the problem of decrease of the emitting efficiency can be prevented or minimized or at least reduced by forming an area (or width) of the second region, in which the second OLED is disposed, to be greater than that of the first region, in which the first OLED is disposed.

Figure 4:
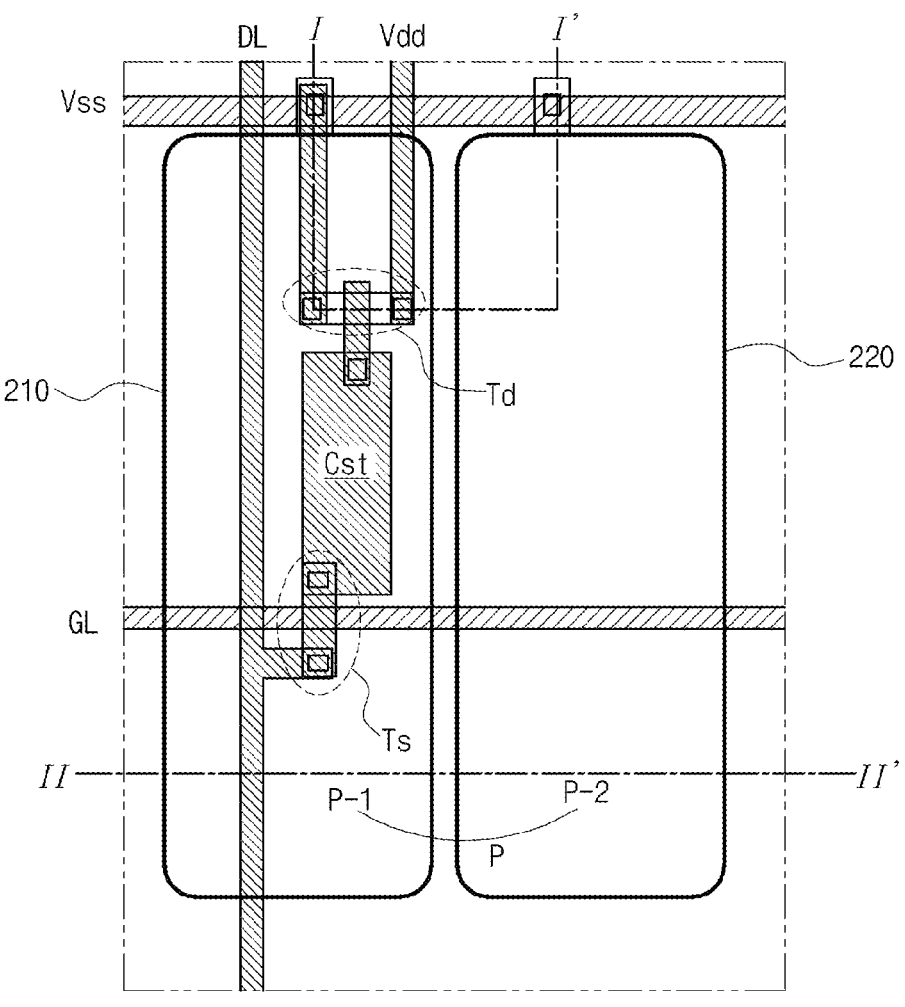
FIG. 4 is a schematic plan view showing a pixel of the organic light emitting display device according to the first embodiment of the present disclosure.

FIG. 4 is a schematic plan view showing a pixel of the organic light emitting display device according to the first embodiment of the present disclosure.

As shown in FIG. 4, the organic light emitting display device includes a gate line GL, a low potential voltage line Vss, a high potential voltage line Vdd, a data line DL, a switching element Ts, a driving element Td, a first OLED D1 and a second OLED D2 in one pixel P.

The gate line GL and the low potential voltage line Vss extend along the first direction "x" to be spaced apart from each other, and the date line DL and the high potential voltage line Vdd extend along the second direction "y", which cross the first direction "x", to be spaced apart from each other. For example, the second direction "y" may be perpendicular to the first direction "x".

The switching element Ts is connected to the gate and data lines GL and DL and may include a semiconductor layer, a gate electrode, a source electrode and a drain electrode. In the switching element Ts, the gate electrode is connected to the gate line GL, and the source electrode is connected to the data line DL.

The driving element Td is connected to the high potential voltage line Vdd and the switching element Ts and may include a semiconductor layer, a gate electrode, a source electrode and a drain electrode. In the driving element Td, the gate electrode is connected to the switching element Ts, and the source electrode is connected to the high potential voltage line Vdd.

The first and second OLEDs D1 and D2 are horizontally disposed and constitute an OLED D. For example, the structure of the OLED D may be referred to as a horizontal tandem structure.

The first OLED D1 includes a first electrode 210, a first organic light emitting layer and a p-type charge generation layer (CGL), and the second OLED D2 includes a second electrode 220, a second organic light emitting layer and a p-type CGL. The p-type CGL has a size, e.g., a plane area, greater than each of the first and second electrodes 210 and 220, and the first and second OLEDs D1 and D2 share the p-type CGL.

The first electrode 210 of the first OLED D1 is connected to the drain electrode of the driving element Td, and the second electrode 220 of the second OLED D2 is connected to the low potential voltage line Vss.

In the organic light emitting display device of the present disclosure, each pixel P includes a first region P-1 and a second region P-2, and the first OLED D1 and the second OLED D2 are respectively positioned in the first region P-1 and the second region P-2.

The organic light emitting display device may further include a storage capacitor Cst. The storage capacitor Cst includes a first storage electrode, a second storage electrode and a dielectric layer therebetween. The first storage electrode is connected to the drain electrode of the switching element Ts or the gate electrode of the driving element Td, and the second storage electrode is connected to the high potential voltage line Vdd or the source electrode of the driving element Td.

In FIG. 4, the first and second regions P-1 and P-2 have the same area, and the first and second electrodes 210 and 220 have the same area. Alternatively, the second region P-2 may have an area greater than the first region P-1, and the second electrode 220 may have an area greater than the first electrode 210.

In the organic light emitting display device of the present disclosure, the first and second OLEDs D1 and D2 share the p-type CGL, and an uppermost layer of each of the first and second OLEDs D1 and D2 is the p-type CGL. Namely, in each of the first and second OLEDs D1 and D2, an organic material layer is stacked on the EML without a high refractive index layer, e.g., a metal layer. Accordingly, a problem of decrease of the light extraction efficiency in the OLED, in which an uppermost layer is a second electrode, by a difference of a refractive index between the organic light emitting layer and the second electrode can be prevented or at least reduced.

Figure 5:
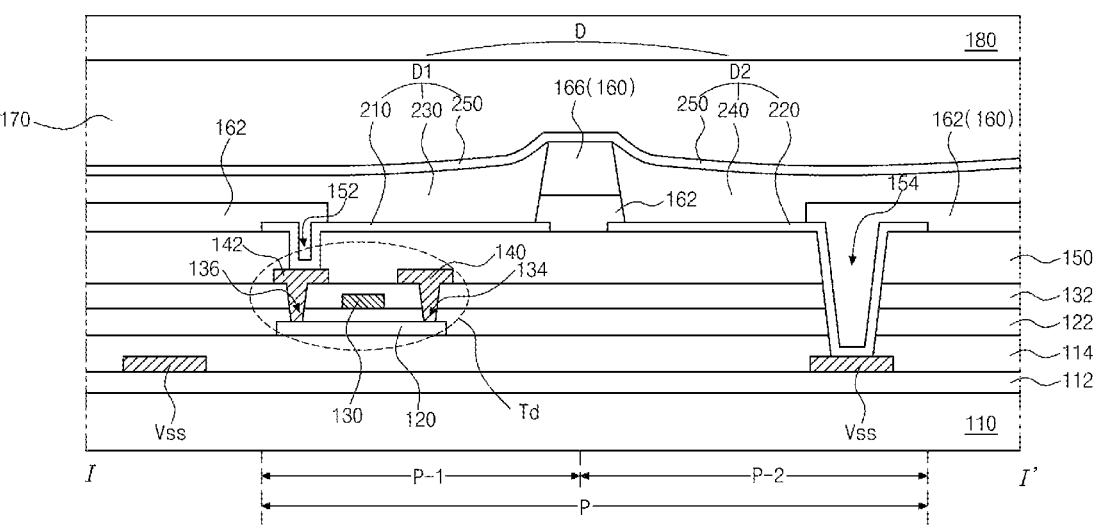
FIG. 5 is a cross-sectional view taken along the line I-I' in FIG. 4 according to an embodiment of the present disclosure.

FIG. 5 is a cross-sectional view taken along the line I-I' in FIG. 4 according to one embodiment.

As shown in FIG. 5, in the organic light emitting display device 100, the driving element Td, the first OLED D1 and the second OLED D2 are formed on a first substrate 110 including a pixel P. The pixel P includes a first region P-1 and a second region P-2.

In addition, the organic light emitting display device 100 may further include an organic material layer 170 covering the first and second OLEDs D1 and D2 and a second substrate 180 on the organic material layer 170.

Each of the first and second substrates 110 and 180 may be a glass substrate or a flexible substrate. For example, the flexible substrate may be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 112 is formed on the first substrate 110, and the low potential voltage line Vss, which is formed of a conductive material, e.g., metal, is formed on the buffer layer 112. Alternatively, the buffer layer 112 may be omitted, and the low potential voltage line Vss may be formed on the first substrate 110.

A second buffer layer 114 is formed on the low potential voltage line Vss. Each of the first and second buffer layers 112 and 114 may be formed of an organic insulating material, e.g., silicon oxide or silicon nitride.

A semiconductor layer 120 is formed on the second buffer layer 114. The semiconductor layer 120 may include an oxide semiconductor material. When the semiconductor layer 120 includes the oxide semiconductor material, a light-shielding pattern (not shown) may be formed under the semiconductor layer 122. The light to the semiconductor layer 120 is shielded or blocked by the light-shielding pattern such that thermal degradation of the semiconductor layer 120 can be prevented or at least reduced.

Alternatively, the semiconductor layer 120 may include polycrystalline silicon. In this case, impurities may be doped into both sides of the semiconductor layer 120.

A gate insulating layer 122 is formed on the semiconductor layer 120 and over an entire surface of the first substrate 110. The gate insulating layer 122 may be formed of an inorganic insulating material such as silicon oxide (SiOx) or silicon nitride (SiNx).

A gate electrode 130, which is formed of a conductive material, e.g., metal, is formed on the gate insulating layer 122 to correspond to a center of the semiconductor layer 120.

In FIG. 5, the gate insulating layer 122 is formed on an entire surface of the first substrate 110. Alternatively, the gate insulating layer 122 may be patterned to have the same shape as the gate electrode 130.

In FIG. 5, the low potential voltage line Vss is disposed between the first and second buffer layers 112 and 114. Alternatively, the low potential voltage line Vss may be formed on the gate insulating layer 122. In this case, the low potential voltage line Vss may be formed of the same material as the gate electrode 130.

The gate line GL is formed on the gate insulating layer 122.

An interlayer insulating layer 132, which is formed of an insulating material, is formed on the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 120. The first and second contact holes 134 and 136 are positioned at both sides of the gate electrode 130 to be spaced apart from the gate electrode 130.

In FIG. 5, the first and second contact holes 134 and 136 are formed through the interlayer insulating layer 132 and the gate insulating layer 122. Alternatively, when the gate insulating layer 122 is patterned to have the same shape as the gate electrode 130, the first and second contact holes 134 and 136 are formed only through the interlayer insulating layer 132.

A source electrode 140 and a drain electrode 142, which are formed of a conductive material, e.g., metal, are formed on the interlayer insulating layer 132. The source electrode 140 and the drain electrode 142 are spaced apart from each other with respect to the gate electrode 130 and respectively contact both sides of the semiconductor layer 120 through the first and second contact holes 134 and 136.

The semiconductor layer 120, the gate electrode 130, the source electrode 140 and the drain electrode 142 constitute the driving element Td. The driving element Td may be a thin film transistor.

In FIG. 5, the gate electrode 130, the source electrode 140, and the drain electrode 142 are positioned over the semiconductor layer 120. Namely, the driving element Td has a coplanar structure.

Alternatively, in the driving element Td, the gate electrode may be positioned under the semiconductor layer, and the source and drain electrodes may be positioned over the semiconductor layer such that the driving element Td may have an inverted staggered structure. In this instance, the semiconductor layer may include amorphous silicon.

In addition, the data line DL and the high potential voltage line Vdd are formed on the interlayer insulating layer 132. Each of the data line DL and the high potential voltage line Vdd may be formed of the same material as the source electrode 140.

The high potential voltage line Vdd is connected to the source electrode 140. For example, the source electrode 140 may extend from the high potential voltage line Vdd.

A switching element Ts, which is connected to the gate line GL and the data line DL, is further disposed in each pixel P. The switching element Ts may be a thin film transistor. The switching element Ts may be connected to the driving element Td.

For example, the switching element Ts may include a semiconductor layer, a gate electrode, a source electrode and a drain electrode. In the switching element Ts, the gate electrode is connected to the gate line GL, the source electrode is connected to the data line DL, and the drain electrode is connected to the gate electrode 130 of the driving element Td.

In each pixel P, a storage capacitor Cst for constantly maintaining the voltage of the gate electrode 130 of the driving element Td during one frame may be further disposed.

A planarization layer 150 is formed on the source electrode 140, the drain electrode 142, the data line DL and the high potential voltage line Vdd and over an entire surface of the first substrate 110. The planarization layer 150 provides a flat top surface and includes a drain contact hole 152 exposing the drain electrode 142 of the driving element Td and a common contact hole 154 exposing the low potential voltage line Vdd. The common contact hole 154 is formed through the planarization layer 150, the interlayer insulating layer 132, the gate insulating layer 122 and the second buffer layer 114.

A first electrode 210 is formed on the planarization layer 150 and in the first region P-1 of the pixel P, and the second electrode 220 is formed on the planarization layer 150 and in the second region P-2 of the pixel P. The first electrode 210 is separated in each pixel P, and the first and second electrodes 210 and 220 in each pixel P are separated.

The first electrode 210 is connected to the drain electrode 142 of the driving element Td through the drain contact hole 152, and the second electrode 220 is connected to the low potential voltage line Vss through the common contact hole 154.

The first electrode 210 may be an anode and may be formed of a conductive material having a relatively high work function value.

The first electrode 210 may include a transparent conductive oxide material layer formed of a transparent conductive oxide (TCO). For example, the transparent conductive oxide may be at least one of indium-tin-oxide (ITO), indium-zinc-oxide (IZO), indium-tin-zinc oxide (ITZO), tin oxide (SnO), zinc oxide (ZnO), indium-copper-oxide (ICO) and aluminum-zinc-oxide (Al:ZnO, AZO).

The first electrode 210 may further include a reflective layer under the transparent conductive oxide material layer. For example, the reflective layer may include silver (Ag) or aluminum-palladium-copper alloy (APC). In the top-emission type OLED D, the first electrode 210 may have a double-layered structure of Ag/ITO or APC/ITO.

The first electrode 210 may further include a transparent conductive oxide material layer under the reflective layer. For example, the first electrode 210 may have a triple-layered structure of ITO/Ag/ITO or ITO/APC/ITO.

The second electrode 220 may be a cathode and may be formed of a conductive material having a relatively low work function value.

For example, the second electrode 220 may be formed of a material such as aluminum (Al), magnesium (Mg), calcium (Ca), silver (Ag), Mg—Ag alloy (Ag:Mg) or APC.

The second electrode 220 may be disposed at the same layer and formed of the same material as the first electrode 210.

For example, each of the first and second electrodes 210 and 220 may be a reflective layer, and the first and second electrodes 210 and 220 may be disposed at the same layer. On the other hand, the first electrode 210 may have a first work function value, and the second electrode 220 may have a second work function value smaller than the first work function value.

A bank layer 160 covering edges of the first electrode 210 and edges of the second electrode 220 is formed on the planarization layer 150. The bank layer 160 may include a first opening exposing the first region P-1 of the pixel P and a second opening exposing the second region P-2 of the pixel P. The first electrode 210 is exposed in the first opening, and the second electrode 220 is exposed in the second opening.

The bank layer 160 includes a first bank 162 having a hydrophilic property and extending along the first direction "x", a second bank 164 having a hydrophobic property and extending along the second direction "y" and a third bank 166 having a hydrophobic property and extending along the second direction "y".

The first bank 162 has a first thickness, and each of the second and third banks 164 and 166 has a second thickness, which may be greater than the first thickness.

The first bank 162 is positioned between adjacent pixels P in the second direction "y", and the second bank 164 is positioned between adjacent pixels P in the first direction "x". The third bank 166 runs across the pixel P and is positioned between adjacent first and second regions P-1 and P-2 in the first direction "x".

A first organic light emitting layer 230 is formed in the first opening and on the first electrode 210, and a second organic light emitting layer 240 is formed in the second opening and on the second electrode 220. The first organic light emitting layer 230 contacts the first electrode 210, and the second organic light emitting layer 240 contacts the second electrode 220.

The light having a first wavelength range is provided from the first organic light emitting layer 230, and the light having a second wavelength range is provided from the second organic light emitting layer 240. The first wavelength range and the second wavelength range are same or different.

For example, each of the first and second organic light emitting layers 230 and 240 emits the light having a wavelength range being one of red light, green and blue. Alternatively, one of the first and second organic light emitting layers 230 may emit a blue light, and the other one of the first and second organic light emitting layers 230 may emit a yellow-green light.

At least a part of the first organic light emitting layer 230 and at least a part of the second organic light emitting layer 240 may be formed by a solution process. For example, the solution process may be an inkjet process or a spin-coating process.

As described above, the first bank 162 has a relatively small thickness, and the adjacent pixels P in the second direction "y" may be a pixel having same color. In this case, the first organic light emitting layer 230 in the first regions P-1 of adjacent pixels P in the second direction "y" may be connected, e.g., be continuous, and the second organic light emitting layer 240 in the second region P-2 of adjacent pixels P in the second direction "y" may be connected.

A p-type CGL 250 is formed over the first substrate 110 including the first and second organic light emitting layers 230 and 240. For example, the p-type CGL 250 may correspond to an entire surface of a display area of the first substrate 110.

The first organic light emitting layer 230 in the first region P-1 and the second organic light emitting layer 240 in the second region P-2 are separated from each other by the third bank 166, while the p-type CGL 250 may be continuous in the first and second regions P-1 and P-2 and cover the third bank 166.

For example, the p-type CGL 250 may have a thickness of 100 to 300 Å. The p-type CGL 250 may include an organic material and a p-type dopant, and the p-type dopant may have a weight % of 1 to 10 in the p-type CGL 250.

For example, the organic material of the p-type CGL 250 may be an aromatic amine compound, e.g., 4,4',4"-tris(3-methylphenylamino)triphenylamine; mTDATA), N,N'-diphenyl-N,N'-bis(1-naphthyl)-1,1'-biphenyl-4,4"-diamine (NPD), or N,N'-bis[4-[bis(3-methylphenyl)amino]phenyl]-N,N'-diphenyl-[1,1'-biphenyl]-4,4'-diamine (DNTPD), but it is not limited thereto. The p-type dopant of the p-type CGL 250 may be one of 2,3,5,6-tetrafluoro-7,7,8,8-tetracyano-quinodimethane(F4-TCNQ), 7-dicyanomethylene-1,3,4,5,6,8,9,10-octafluoro-7H-pyren-2-ylidene)-malononitrile (NDP-9), hexacyano-trimethylene-cyclopropane (CN6-CP), but it is not limited thereto.

The p-type CGL 250 may be formed by a deposition process or a solution process.

The third bank 166 may have a thickness smaller than the second bank 164 so that the p-type CGL 250, which is formed by a solution process, in the first and second regions P-1 and P-2 may be continuous. Alternatively, the p-type CGL 250 may have a sufficient thickness so that the p-type CGL 250 in the first and second regions P-1 and P-2 may be continuous.

For example, the first organic light emitting layer 230 may include a first emitting material layer (EML), a first hole auxiliary layer under the first EML, a first electron auxiliary layer on the first EML and a n-type CGL on the first electron auxiliary layer, and the second organic light emitting layer 240 may include a second EML, a second electron auxiliary layer under the second EML and a second hole auxiliary layer on the second EML.

The p-type CGL 250 in the first region P-1 may contact the n-type CGL, and the p-type CGL 250 in the second region P-2 may contact the second hole auxiliary layer. As a result, a P-N junction CGL including the p-type CGL 250 and the n-type CGL can be provided in the first region P-1.

When the voltage is applied to the first and second electrodes 210 and 220, an electron is transferred from the n-type CGL into the first EML of the first OLED D1, and a hole in the p-type CGL 250 in the first region P-1 is transferred into the second EML through the p-type CGL 250 in the second region P-2.

Accordingly, in the first OLED D1, the hole from the first electrode 210 and the electron from the n-type CGL are combined at the first EML so that the light is emitted. In the second OLED d2, the electron from the second electrode 220 and the hole from the p-type CGL 250 are combined at the second EML so that the light is emitted.

As described above, the p-type CGL 250 includes the p-type dopant to have a relatively high conductivity. As a result, there is a lateral current in the p-type CGL 250 so that the hole in the p-type CGL 250 in the first region P-1 can move into the p-type CGL 250 in the second region P-2.

Accordingly, each of the OLED D1 and the OLED D2 horizontally arranged can emit light.

On the other hand, the hole in the p-type CGL 250 in one pixel P may be transferred into the p-type CGL 250 in adjacent pixel P by the lateral current in the p-type CGL 250. However, since each of the first and second banks 162 and 164 between adjacent pixels P has a width greater than the third bank 166 between the first and second regions P-1 and P-2, the hole transfer into adjacent pixel P can be prevented or minimized or at least reduced.

In FIG. 5, the p-type CGL 250 is formed on an entire surface of a display area so that the p-type CGL 250 is continuous through adjacent pixels P. Alternatively, the p-type CGL 250 may have an island shape corresponding to the first and second pixels P-1 and P-2 of one pixel P. Namely, the p-type CGL 250 in a first pixel and the p-type CGL 250 in a second pixel, which is adjacent to the first pixel, may be separated.

An organic material layer 170 is disposed on the p-type CGL 250, and a second substrate 180 is disposed on the organic material layer 170.

For example, the organic material layer 170 may include a capping layer for enhancing light extraction. In addition, the organic material layer 170 may include an encapsulation layer for preventing or at least reducing moisture penetration. For example, the organic material layer 170 may include the capping layer and the encapsulation layer.

As described above, the p-type CGL 250 and the organic material layer 170 are stacked on the first and second organic light emitting layers 230 and 240 so that the problem of decrease of the light extraction efficiency by a refractive index difference at light path can be prevented or at least reduced.

Namely, in the OLED including the second electrode, which is formed of a material having a high refractive index, at an uppermost layer, the light extraction efficiency is decreased by a refractive index difference between the organic light emitting layer and the second electrode.

However, in the organic light emitting display device 100 of the present disclosure, the first and second electrodes 210 and 220 are respectively disposed at a lowest layer of the first and second OLEDs D1 and D2, and there are layers formed of an organic material at light path. As a result, the above problem of decrease of the light extraction efficiency can be prevented or minimized or at least reduced.

Figure 6:
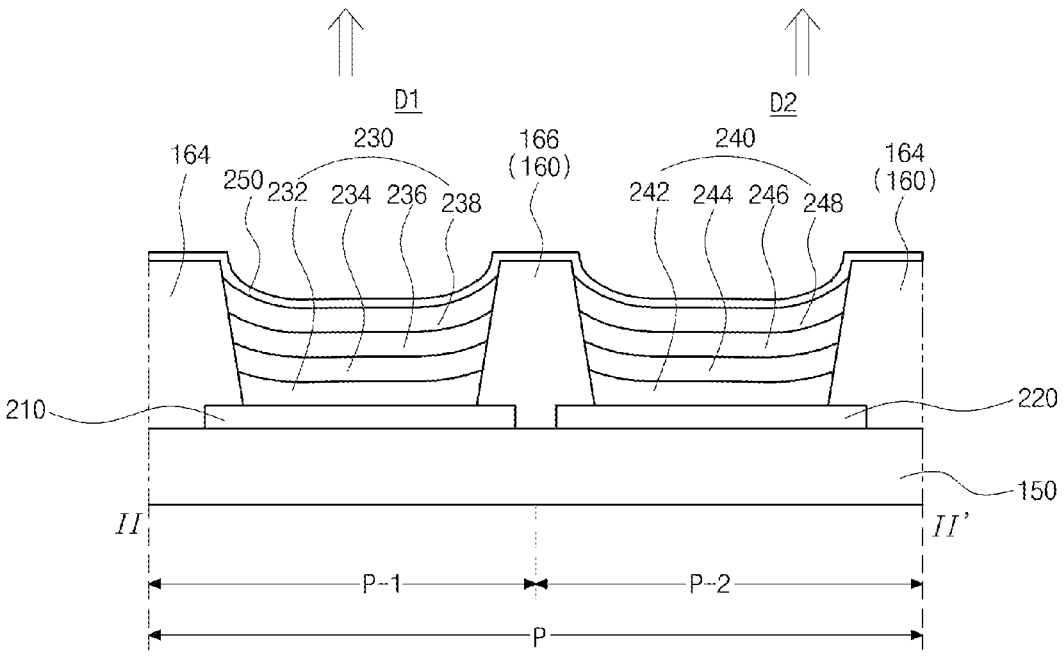
FIG. 6 is a cross-sectional view taken along the line II-II' in FIG. 4 and showing an OLED according to an embodiment of the present disclosure.

FIG. 6 is a cross-sectional view taken along the line II-II' in FIG. 4 and showing an OLED according to one embodiment.

FIG. 6 shows the first and second OLEDs D1 and D2 and the second and third banks 164 and 166 of the bank layer 160. Since elements between the first substrate 110 and the planarization layer 150 and elements between the OLED D and the second substrate 180 have been described, illustration and description thereof are omitted.

As shown in FIG. 6, in the organic light emitting display device of the present disclosure, the first OLED D1 and the second OLED D2 are horizontally disposed so that the OLED D in the organic light emitting display device has a horizontal tandem structure.

The first OLED D1 is positioned in the first region P-1 surrounded by the first to third banks 162, 164 and 166, and the second OLED D2 is positioned in the second region P-2 surrounded by the first to third banks 162, 164 and 166. The first and second OLEDs D1 and D2 are disposed on the planarization layer 150.

The first OLED D1 includes the first electrode 210 as an anode and the first organic light emitting layer 230, and the first organic light emitting layer 230 includes a first EML 236 on the first electrode 210, a first hole auxiliary layer between the first electrode 210 and the first EML 236 and an n-type CGL 238 on the first EML 236. The first hole auxiliary layer may include a first hole injection layer (HIL) 232 and a first hole transporting layer (HTL) 234. In addition, the first organic light emitting layer 230 may further include a first electron auxiliary layer between the first EML 236 and the n-type CGL 238.

The second OLED D2 includes the second electrode 220 as a cathode and a second organic light emitting layer 240, and the second organic light emitting layer 240 includes a second EML 244 on the second electrode 220, a second electron auxiliary layer 242 between the second electrode 220 and the second EML 244 and a second hole auxiliary layer on the second EML 244. The second hole auxiliary layer may include a second HIL 248 and a second HTL 246. The second electron auxiliary layer may be an electron transporting layer (ETL), and the second organic light emitting layer 240 may further include an electron injection layer (EIL) between the second electrode 220 and the second electron auxiliary layer 242.

Each of the first HIL 232, the first HTL 234, the first EML 236, the n-type CGL 238, the second electron auxiliary layer 242, the second EML 244, the second HTL 246 and the second HIL 248 may be formed by a solution process.

Each of the first and second HILs 232 and 248 may have a thickness of 400 to 1500 Å, and may include a conductive polymer, e.g., PEDOT:PSS, including a thiophene group and/or a sulfonate group or an aromatic amine compound.

Each of the first and second HTLs 234 and 246 may have a thickness of 400 to 1200 Å, and may include an aromatic amine compound, e.g., 4'-bis(N-carbazolyl)-1,1'-biphenyl (CBP), NPD or tris(4-carbazoyl-9-yl-phenyl)amine (TCTA).

A thickness of the second electron auxiliary layer 242 between the second electrode 220 and the second EML 244 may be smaller than that of the first hole auxiliary layer 232 and 234 between the first electrode 210 and the first EML 236. Namely, a distance between the second electrode 220 and the second EML 244 may be smaller than that between the first electrode 210 and the first EML 236.

The second electron auxiliary layer 242 may have a thickness of 200 to 400 Å and may include a nano-particle of a metal oxide material, e.g., $MoO_3$, $WO_3$, NiO, $V_2O_5$, CuO, or $RuO_2$.

The n-type CGL 238 may have a thickness of 100 to 300 Å and may include an organic material and an n-type dopant. For example, the organic material of the n-type CGL 238 may be an aromatic conductive polymer, e.g., PEDOT:PSS, including a thiophene group and/or a sulfonate group, and the n-type dopant of the n-type CGL 238 may be polyethyleneimine (PEI) or polyethyleneimine-ethoxylated (PEIE).

Each of the first and second EMLs 236 and 244 may have a thickness of 400 to 700 Å. An emission wavelength range of the first EML 236 and an emission wavelength range of the second EML 244 may be same or different.

For example, the first and second EMLs 234 and 244 may emit the same color light and may be one of a red EML, a green EML, a blue EML and a yellow-green EML.

The red EML may include a red host and a red dopant, and the green EML may include a green host and a green dopant. The blue EML may include a blue host and a blue dopant, and the yellow-green EML may include a yellow-green host and a yellow-green dopant.

Alternatively, one of the first and second EMLs 236 and 244 may be a blue EML, and the other one of the first and second EMLs 236 and 244 may include a red EML and a green EML.

The p-type CGL 250 is formed on the n-type CGL 238 in the first region P-1 and the second HIL 248 in the second region P-2.

Each of the first and second electrodes 210 and 220 may be a reflective electrode, and the light from each of the first and second organic light emitting layers 230 and 240 passes through the p-type CGL 250.

Figure 7:
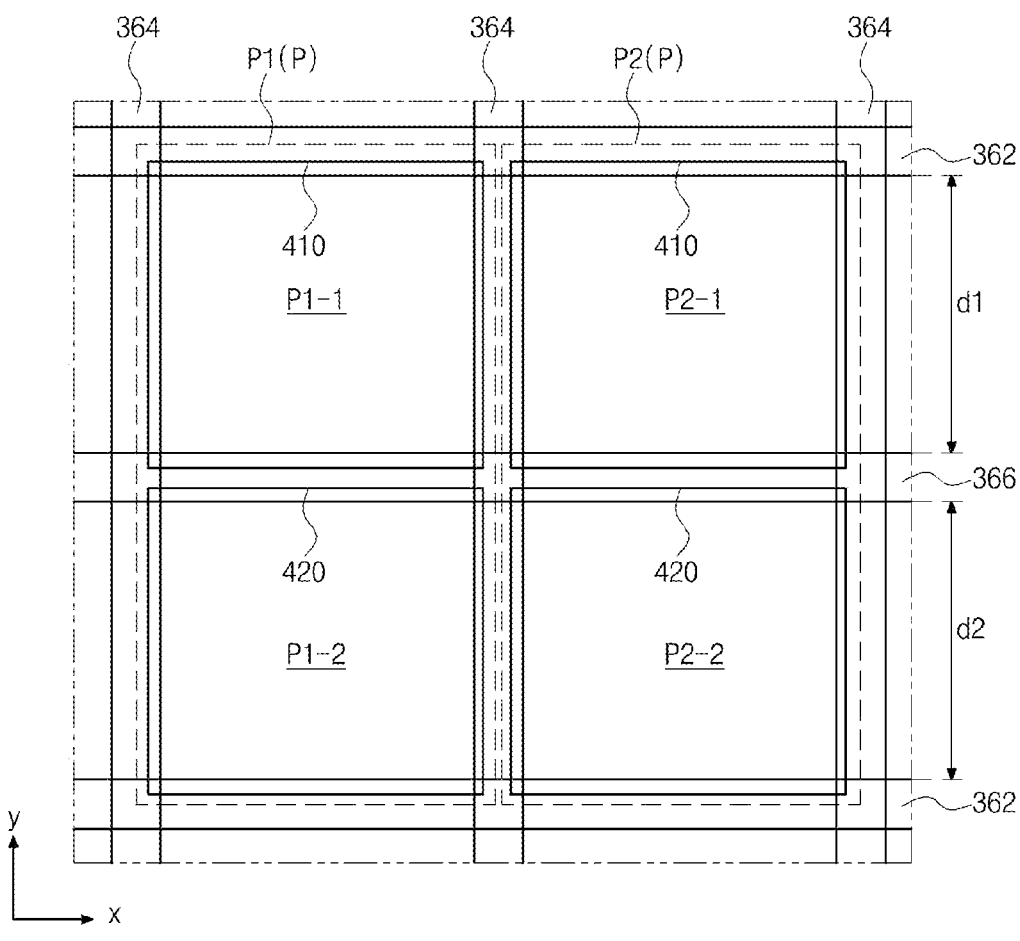
FIG. 7 is a schematic plan view showing a pixel arrangement configuration of an organic light emitting display device according to a third embodiment of the present disclosure.

FIG. 7 is a schematic plan view showing a pixel arrangement configuration of an organic light emitting display device according to a third embodiment of the present disclosure.

As shown in FIG. 7, the organic light emitting display device includes a first bank 362, which extends along a first direction "x" and is spaced apart from each other in a second direction "y" crossing the first direction "x", a second bank 364, which extends along the second direction "y" and is spaced apart from each other in the first direction "x", and a third bank 366, which extends along the first direction "x" and is positioned between the first banks 362.

The first and second banks 362 and 364 cross each other to define the pixel P. The pixel P includes a first pixel P1 and a second pixel P2, and the first and second pixels P1 and P2 are different color pixels.

The third bank 366 runs across the pixel P so that the pixel P is divided into two regions by the third bank 366. Namely, the first pixel P1 is divided into a first region P1-1 and a second region P1-2 by the third bank 366, and the second pixel P2 is divided into a first region P2-1 and a second region P2-2 by the third bank 366.

A first OLED including a first electrode 410 as an anode is disposed in each of the first regions P1-1 and P2-1, and a second OLED including a second electrode 420 as a cathode is disposed in each of the second regions P1-2 and P2-2.

However, an arrangement of the first and second OLEDs is not limited thereto.

In some embodiments of the present disclosure, the first OLED and the second OLED may be disposed in the first region P1-1 and the second region P1-2 in the first pixel P1, respectively, and the second OLED and the first OLED may be disposed in the first region P2-1 and the second region P2-2 in the second pixel P2, respectively.

An upper surface of the first to third banks 362, 364 and 366 has a hydrophobic property. For example, each of the first to third banks 362, 364 and 366 may include a lower bank having a hydrophilic property and an upper bank having an upper surface of a hydrophobic property. Namely, each of the first to third banks 362, 364 and 366 may have a double-layered structure.

The first to third banks 362, 364 and 366 may have the same thickness. Alternatively, a thickness of the third bank 366 may be smaller than that of each of the first and second banks 362 and 364.

The first to third banks 362, 364 and 366 may have the same width.

In each of the first regions P1-1 and P2-1, the first and third banks 362 and 366 are spaced apart from each other by a first distance d1. In each of the second regions P1-2 and P2-2, the first and third banks 362 and 366 are spaced apart from each other by a second distance d2, which may be substantially same as the first distance d1. Namely, the first regions P1-1 and P2-1 may have substantially same width and area as the second regions P1-2 and P2-2, respectively.

Figure 8:
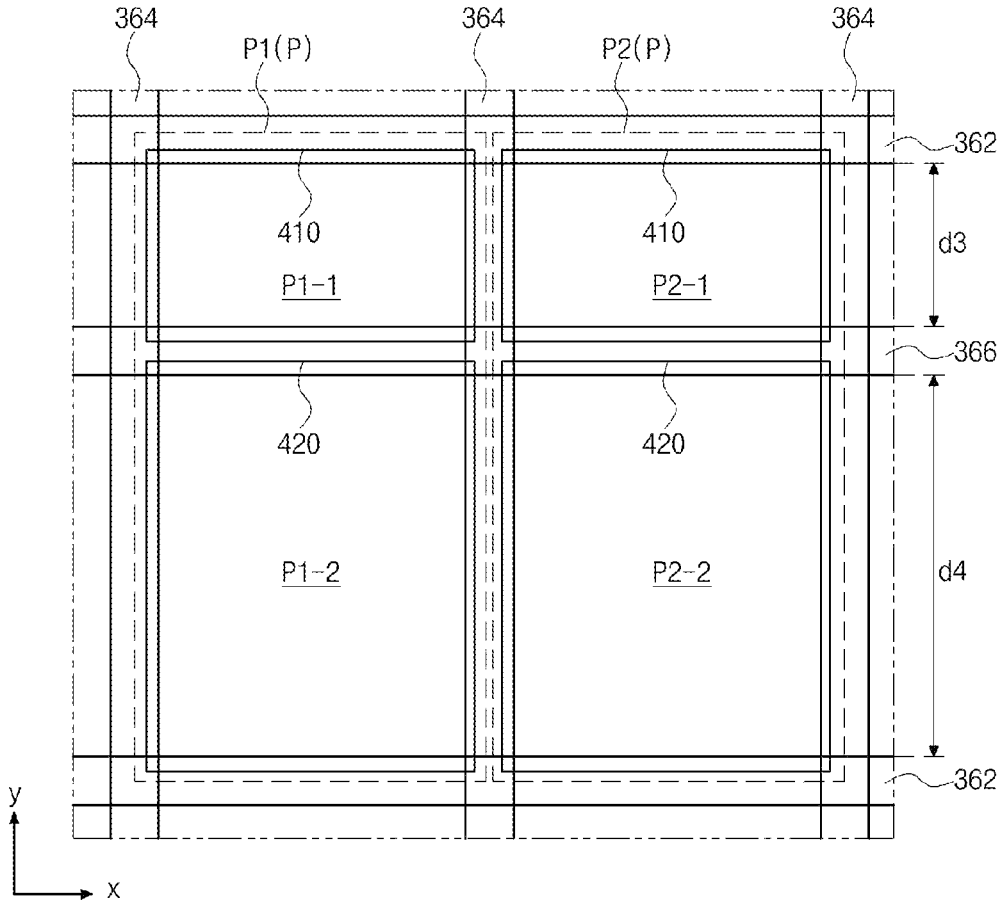
FIG. 8 is a schematic plan view showing a pixel arrangement configuration of an organic light emitting display device according to a fourth embodiment of the present disclosure.

FIG. 8 is a schematic plan view showing a pixel arrangement configuration of an organic light emitting display device according to a fourth embodiment of the present disclosure.

The pixel arrangement configuration of the organic light emitting display device in FIG. 8 and the pixel arrangement configuration of the organic light emitting display device in FIG. 7 have a difference in a width of the first and second regions.

Namely, in the organic light emitting display device in FIG. 7, the first distance d1 between the first and third banks 362 and 366 in each of the first regions P1-1 and P2-1 and the second distance d2 between the first and third banks 362 and 366 in each of the second regions P1-2 and P2-2 are substantially same. In other words, the first regions P1-1 and P2-1 and the second regions P1-2 and P2-2 have substantially the same width, respectively.

In the organic light emitting display device in FIG. 8, the first and third banks 362 and 366 in each of the first regions P1-1 and P2-1 are spaced apart from each other by a third distance d3, and the first and third banks 362 and 366 in each of the second regions P1-2 and P2-2 are spaced apart from each other by a fourth distance d4 being greater than the third distance d3. In other words, the second regions P1-2 and P2-2 have a width greater than the first regions P1-1 and P2-1, respectively, and the second regions P1-2 and P2-2 have an area greater than the first regions P1-1 and P2-1, respectively.

The first OLED in each of the first regions P1-1 and P2-1 has a normal structure, and the second OLED in each of the second regions P1-2 and P2-2 has an inverted structure. A distance between an emitting material layer (EML) and the second electrode in the second OLED is smaller than that between the EML and the second electrode in the first OLED so that the emitting efficiency of the second OLED in the second region may be decreased by a plasmon effect. In the organic light emitting display device of the present disclosure, the problem of decrease of the emitting efficiency can be prevented or minimized or at least reduced by forming an area (or width) of the second region, in which the second OLED is disposed, to be greater than that of the first region, in which the first OLED is disposed.

Figure 9:
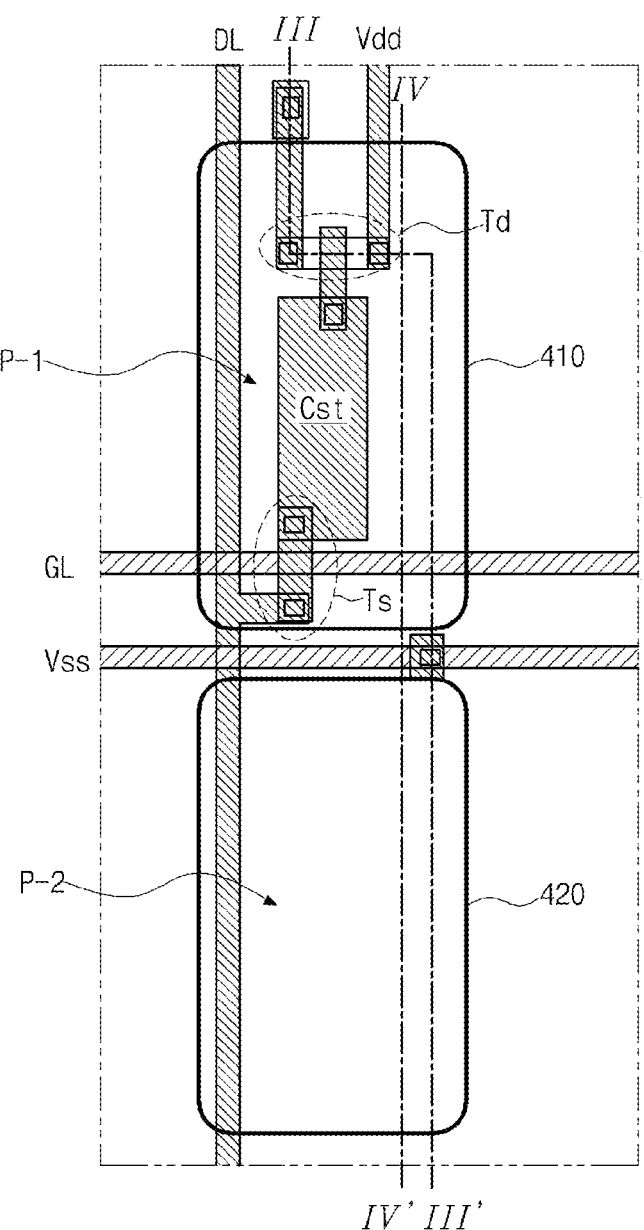
FIG. 9 is a schematic plan view showing a pixel of the organic light emitting display device according to the third embodiment of the present disclosure.

FIG. 9 is a schematic plan view showing a pixel of the organic light emitting display device according to the third embodiment of the present disclosure.

As shown in FIG. 9, the organic light emitting display device includes a gate line GL, a low potential voltage line Vss, a high potential voltage line Vdd, a data line DL, a switching element Ts, a driving element Td, a first OLED D1 and a second OLED D2 in one pixel P.

The gate line GL and the low potential voltage line Vss extend along the first direction "x" to be spaced apart from each other, and the date line DL and the high potential voltage line Vdd extend along the second direction "y", which cross the first direction "x", to be spaced apart from each other. For example, the second direction "y" may be perpendicular to the first direction "x".

The switching element Ts is connected to the gate and data lines GL and DL and may include a semiconductor layer, a gate electrode, a source electrode and a drain electrode. In the switching element Ts, the gate electrode is connected to the gate line GL, and the source electrode is connected to the data line DL.

The driving element Td is connected to the high potential voltage line Vdd and the switching element Ts and may include a semiconductor layer, a gate electrode, a source electrode and a drain electrode. In the driving element Td, the gate electrode is connected to the switching element Ts, and the source electrode is connected to the high potential voltage line Vdd.

The first and second OLEDs D1 and D2 are horizontally disposed and constitute an OLED D. For example, the structure of the OLED D may be referred to as a horizontal tandem structure.

The first OLED D1 includes a first electrode 410, a first organic light emitting layer and a p-type charge generation layer (CGL), and the second OLED D2 includes a second electrode 420, a second organic light emitting layer and a p-type CGL. The p-type CGL has a size, e.g., a plane area, greater than each of the first and second electrodes 410 and 420, and the first and second OLEDs D1 and D2 share the p-type CGL.

The first electrode 410 of the first OLED D1 is connected to the drain electrode of the driving element Td, and the second electrode 420 of the second OLED D2 is connected to the low potential voltage line Vss.

In the organic light emitting display device of the present disclosure, each pixel P includes a first region P-1 and a second region P-2, and the first OLED D1 and the second OLED D2 are respectively positioned in the first region P-1 and the second region P-2.

The organic light emitting display device may further include a storage capacitor Cst. The storage capacitor Cst includes a first storage electrode, a second storage electrode and a dielectric layer therebetween. The first storage electrode is connected to the drain electrode of the switching element Ts or the gate electrode of the driving element Td, and the second storage electrode is connected to the high potential voltage line Vdd or the source electrode of the driving element Td.

In FIG. 9, the first and second regions P-1 and P-2 have the same area, and the first and second electrodes 410 and 420 have the same area. Alternatively, the second region P-2 may have an area greater than the first region P-1, and the second electrode 420 may have an area greater than the first electrode 410.

In the organic light emitting display device of the present disclosure, the first and second OLEDs D1 and D2 share the p-type CGL, and an uppermost layer of each of the first and second OLEDs D1 and D2 is the p-type CGL. Namely, in each of the first and second OLEDs D1 and D2, an organic material layer is stacked on the EML without a high refractive index layer, e.g., a metal layer. Accordingly, a problem of decrease of the light extraction efficiency in the OLED, in which an uppermost layer is a second electrode, by a difference of a refractive index between the organic light emitting layer and the second electrode can be prevented or at least reduced.

Figure 10:
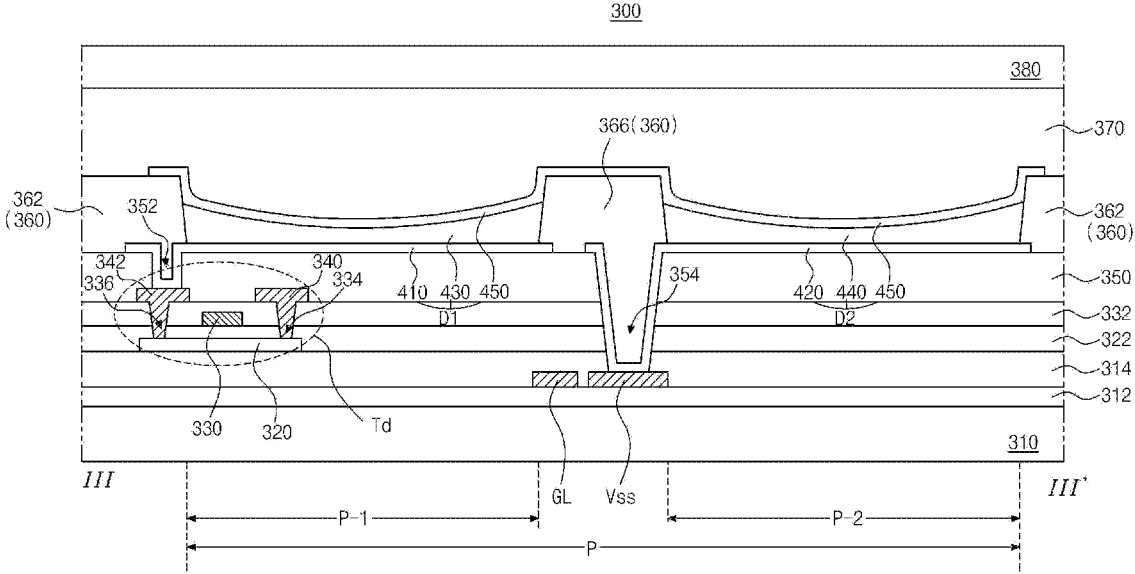
FIG. 10 is a cross-sectional view taken along the line III-III' in FIG. 9 according to an embodiment of the present disclosure.

FIG. 10 is a cross-sectional view taken along the line III-III' in FIG. 9 according to one embodiment.

As shown in FIG. 10, in the organic light emitting display device 300, the driving element Td, the first OLED D1 and the second OLED D2 are formed on a first substrate 310 including a pixel P. The pixel P includes a first region P-1 and a second region P-2.

In addition, the organic light emitting display device 300 may further includes an organic material layer 370 covering the first and second OLEDs D1 and D2 and a second substrate 380 on the organic material layer 370.

Each of the first and second substrates 310 and 380 may be a glass substrate or a flexible substrate. For example, the flexible substrate may be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 312 is formed on the first substrate 310, and the low potential voltage line Vss, which is formed of a conductive material, e.g., metal, is formed on the buffer layer 312. Alternatively, the buffer layer 312 may be omitted, and the low potential voltage line Vss may be formed on the first substrate 310.

A second buffer layer 314 is formed on the low potential voltage line Vss. Each of the first and second buffer layers 312 and 314 may be formed of an organic insulating material, e.g., silicon oxide or silicon nitride.

A semiconductor layer 320 is formed on the second buffer layer 314. The semiconductor layer 320 may include an oxide semiconductor material.

A gate insulating layer 322 is formed on the semiconductor layer 320 and over an entire surface of the first substrate 310. The gate insulating layer 322 may be formed of an inorganic insulating material such as silicon oxide (SiOx) or silicon nitride (SiNx).

A gate electrode 330, which is formed of a conductive material, e.g., metal, is formed on the gate insulating layer 322 to correspond to a center of the semiconductor layer 320.

A gate line GL is formed on the gate insulating layer 322.

An interlayer insulating layer 332, which is formed of an insulating material, is formed on the gate electrode 330. The interlayer insulating layer 332 may be formed of an inorganic insulating material, e.g., silicon oxide or silicon nitride, or an organic insulating material, e.g., benzocyclobutene or photo-acryl.

The interlayer insulating layer 332 includes first and second contact holes 334 and 336 exposing both sides of the semiconductor layer 320. The first and second contact holes 334 and 336 are positioned at both sides of the gate electrode 330 to be spaced apart from the gate electrode 330.

A source electrode 340 and a drain electrode 342, which are formed of a conductive material, e.g., metal, are formed on the interlayer insulating layer 332. The source electrode 340 and the drain electrode 342 are spaced apart from each other with respect to the gate electrode 330 and respectively contact both sides of the semiconductor layer 320 through the first and second contact holes 334 and 336.

The semiconductor layer 320, the gate electrode 330, the source electrode 340 and the drain electrode 342 constitute the driving element Td. The driving element Td may be a thin film transistor.

In addition, the data line DL and the high potential voltage line Vdd are formed on the interlayer insulating layer 332.

Each of the data line DL and the high potential voltage line Vdd may be formed of the same material as the source electrode 340.

The high potential voltage line Vdd is connected to the source electrode 340. For example, the source electrode 340 may extend from the high potential voltage line Vdd.

A switching element Ts, which is connected to the gate line GL and the data line DL, is further disposed in each pixel P. The switching element Ts may be a thin film transistor. The switching element Ts may be connected to the driving element Td.

For example, the switching element Ts may include a semiconductor layer, a gate electrode, a source electrode and a drain electrode. In the switching element Ts, the gate electrode is connected to the gate line GL, the source electrode is connected to the data line DL, and the drain electrode is connected to the gate electrode 330 of the driving element Td.

In each pixel P, a storage capacitor Cst for constantly maintaining the voltage of the gate electrode 330 of the driving element Td during one frame may be further disposed.

A planarization layer 350 is formed on the source electrode 340, the drain electrode 342, the data line DL and the high potential voltage line Vdd and over an entire surface of the first substrate 310. The planarization layer 350 provides a flat top surface and includes a drain contact hole 352 exposing the drain electrode 342 of the driving element Td and a common contact hole 354 exposing the low potential voltage line Vdd. The common contact hole 354 is formed through the planarization layer 350, the interlayer insulating layer 332, the gate insulating layer 322 and the second buffer layer 314.

A first electrode 410 is formed on the planarization layer 350 and in the first region P-1 of the pixel P, and the second electrode 420 is formed on the planarization layer 350 and in the second region P-2 of the pixel P. The first electrode 410 is separated in each pixel P, and the first and second electrodes 410 and 420 in each pixel P are separated.

The first electrode 410 is connected to the drain electrode 342 of the driving element Td through the drain contact hole 352, and the second electrode 420 is connected to the low potential voltage line Vss through the common contact hole 354.

The first electrode 410 may be an anode and may be formed of a conductive material having a relatively high work function value.

The first electrode 410 may include a transparent conductive oxide material layer formed of a transparent conductive oxide (TCO). For example, the transparent conductive oxide may be at least one of indium-tin-oxide (ITO), indium-zinc-oxide (IZO), indium-tin-zinc oxide (ITZO), tin oxide (SnO), zinc oxide (ZnO), indium-copper-oxide (ICO) and aluminum-zinc-oxide (Al:ZnO, AZO).

The first electrode 410 may further include a reflective layer under the transparent conductive oxide material layer. For example, the reflective layer may include silver (Ag) or aluminum-palladium-copper alloy (APC). In the top-emission type OLED D, the first electrode 410 may have a double-layered structure of Ag/ITO or APC/ITO.

The first electrode 410 may further include a transparent conductive oxide material layer under the reflective layer. For example, the first electrode 410 may have a triple-layered structure of ITO/Ag/ITO or ITO/APC/ITO.

The second electrode 420 may be a cathode and may be formed of a conductive material having a relatively low work function value.

For example, the second electrode 420 may be formed of a material such as aluminum (Al), magnesium (Mg), calcium (Ca), silver (Ag), Mg—Ag alloy (Ag:Mg) or APC.

The second electrode 420 may be disposed at the same layer and formed of the same material as the first electrode 410.

For example, each of the first and second electrodes 410 and 420 may be a reflective layer, and the first and second electrodes 410 and 420 may be disposed at the same layer. On the other hand, the first electrode 410 may have a first work function value, and the second electrode 420 may have a second work function value lower than the first work function value.

A bank layer 360 covering edges of the first electrode 410 and edges of the second electrode 420 is formed on the planarization layer 350. The bank layer 360 may include a first opening exposing the first region P-1 of the pixel P and a second opening exposing the second region P-2 of the pixel P. The first electrode 410 is exposed in the first opening, and the second electrode 420 is exposed in the second opening.

The bank layer 360 includes a first bank 362 extending along the first direction "x", a second bank 364 extending along the second direction "y" and a third bank 366 extending along the first direction "x" and positioned between adjacent first banks 362. For example, the third bank 366 may correspond to the low potential voltage line Vss.

The first bank 362 is positioned between adjacent pixels P in the second direction "y", and the second bank 364 is positioned between adjacent pixels P in the first direction "x". The third bank 366 runs across the pixel P and is positioned between adjacent first and second regions P-1 and P-2 in the second direction "y".

A first organic light emitting layer 430 is formed in the first opening and on the first electrode 410, and a second organic light emitting layer 440 is formed in the second opening and on the second electrode 420. The first organic light emitting layer 430 contacts the first electrode 410, and the second organic light emitting layer 440 contacts the second electrode 420.

The light having a first wavelength range is provided from the first organic light emitting layer 430, and the light having a second wavelength range is provided from the second organic light emitting layer 440. The first wavelength range and the second wavelength range are same or different.

For example, each of the first and second organic light emitting layers 430 and 440 emits the light having a wavelength range being one of red light, green or blue. Alternatively, one of the first and second organic light emitting layers 430 may emit a blue light, and the other one of the first and second organic light emitting layers 430 may emit a yellow-green light.

At least a part of the first organic light emitting layer 430 and at least a part of the second organic light emitting layer 440 may be formed by a solution process. For example, the solution process may be an inkjet process or a spin-coating process.

A p-type CGL 450 is formed over the first substrate 310 including the first and second organic light emitting layers 430 and 440. For example, the p-type CGL 450 may correspond to the first and second regions P-1 and P-2 and may be separated in each pixel P. Namely, the p-type CGL 450 in one pixel P is presented as one-body, and the p-type CGL 450 in one pixel P and the p-type CGL 450 in adjacent pixel P may be separated.

The first organic light emitting layer 430 in the first region P-1 and the second organic light emitting layer 440 in the second region P-2 are separated from each other by the third bank 366, while the p-type CGL 450 may be continuous in the first and second regions P-1 and P-2 and cover the third bank 366.

For example, the p-type CGL 450 may have a thickness of 100 to 300 Å. The p-type CGL 450 may include an organic material and a p-type dopant, and the p-type dopant may have a weight % of 1 to 10 in the p-type CGL 450.

For example, the organic material of the p-type CGL 450 may be an aromatic amine compound, e.g., 4,4',4"-tris(3-methylphenylamino)triphenylamine; mTDATA), N,N'-di-phenyl-N,N'-bis(1-naphthyl)-1,1'-biphenyl-4,4"-diamine (NPD), or N,N'-bis[4-[bis(3-methylphenyl)amino]phenyl]-N,N'-diphenyl-[1,1'-biphenyl]-4,4'-diamine (DNTPD), but it is not limited thereto. The p-type dopant of the p-type CGL 450 may be one of 2,3,5,6-tetrafluoro-7,7,8,8-tetracyano-quinodimethane(F4-TCNQ), 7-dicyanomethylene-1,3,4,5,6, 8,9,10-octafluoro-7H-pyren-2-ylidene)-malononitrile (NDP-9), hexacyano-trimethylene-cyclopropane (CN6-CP), but it is not limited thereto.

The p-type CGL 450 may be formed by a deposition process or a solution process.

For example, the first organic light emitting layer 430 may include a first emitting material layer (EML), a first hole auxiliary layer under the first EML, a first electron auxiliary layer on the first EML and a n-type CGL on the first electron auxiliary layer, and the second organic light emitting layer 440 may include a second EML, a second electron auxiliary layer under the second EML and a second hole auxiliary layer on the second EML.

The p-type CGL 450 in the first region P-1 may contact the n-type CGL, and the p-type CGL 450 in the second region P-2 may contact the second hole auxiliary layer. As a result, a P-N junction CGL including the p-type CGL 450 and the n-type CGL can be provided in the first region P-1.

When the voltage is applied to the first and second electrodes 410 and 420, an electron is transferred from the n-type CGL into the first EML of the first OLED D1, and a hole in the p-type CGL 450 in the first region P-1 is transferred into the second EML through the p-type CGL 450 in the second region P-2.

Accordingly, in the first OLED D1, the hole from the first electrode 410 and the electron from the n-type CGL are combined at the first EML so that the light is emitted. In the second OLED d2, the electron from the second electrode 420 and the hole from the p-type CGL 450 are combined at the second EML so that the light is emitted.

As described above, the p-type CGL 450 includes the p-type dopant to have a relatively high conductivity. As a result, there is a lateral current in the p-type CGL 450 so that the hole in the p-type CGL 450 in the first region P-1 can move into the p-type CGL 450 in the second region P-2.

Accordingly, each of the OLED D1 and the OLED D2 horizontally arranged can emit light.

On the other hand, the hole in the p-type CGL 450 in one pixel P may be transferred into the p-type CGL 450 in adjacent pixel P by the lateral current in the p-type CGL 450. However, since the p-type CGL 450 in the pixels P are separated from each other, the hole transfer into adjacent pixel P can be prevented or at least reduced.

An organic material layer 370 is disposed on the p-type CGL 450, and a second substrate 380 is disposed on the organic material layer 370.

For example, the organic material layer 370 may include a capping layer for enhancing a light extraction. In addition, the organic material layer 370 may include an encapsulation layer for preventing or at least reducing moisture penetration. For example, the organic material layer 370 may include the capping layer and the encapsulation layer.

As described above, the p-type CGL 450 and the organic material layer 370 are stacked on the first and second organic light emitting layers 430 and 440 so that the problem of decrease of the light extraction efficiency by a refractive index difference at light path can be prevented or at least reduced.

Namely, in the OLED including the second electrode, which is formed of a material having a high refractive index, at an uppermost layer, the light extraction efficiency is decreased by a refractive index difference between the organic light emitting layer and the second electrode.

However, in the organic light emitting display device 300 of the present disclosure, the first and second electrodes 410 and 420 are respectively disposed at a lowest layer of the first and second OLEDs D1 and D2, and there are layers formed of an organic material at light path. As a result, the above problem of decrease of the light extraction efficiency can be prevented or minimized or at least reduced.

Figure 11:
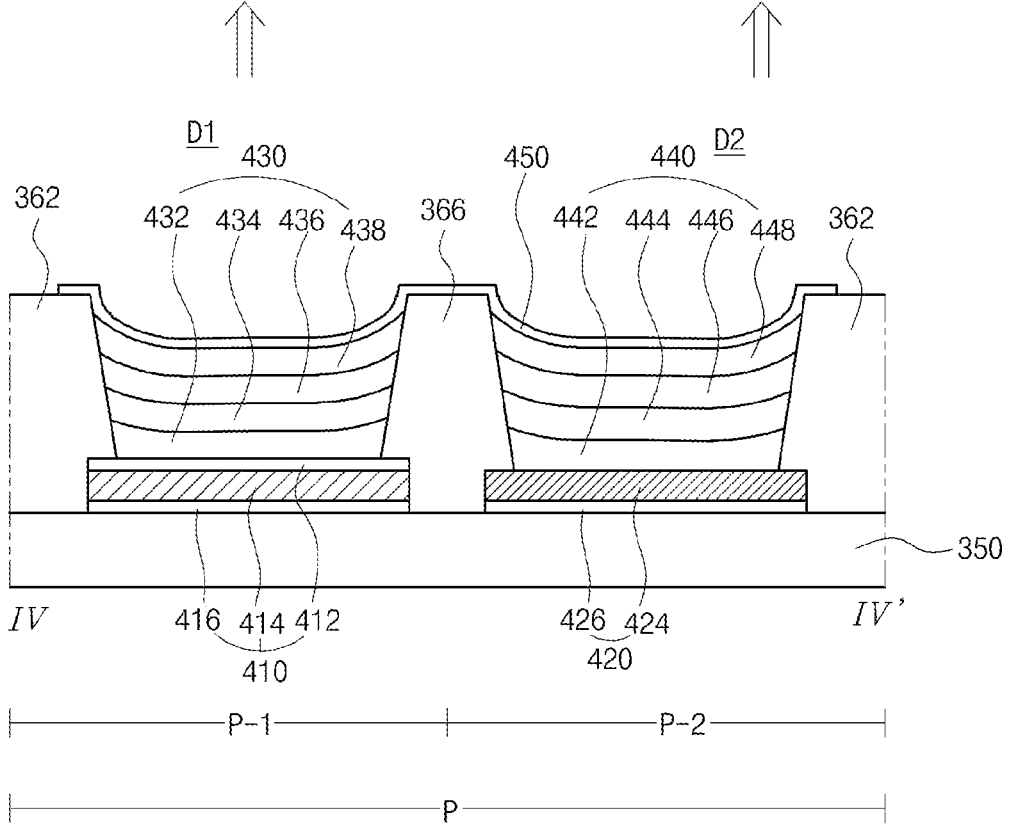
FIG. 11 is a cross-sectional view taken along the line IV-IV' in FIG. 9 and showing an OLED according to an embodiment of the present disclosure.

FIG. 11 is a cross-sectional view taken along the line IV-IV' in FIG. 9 and showing an OLED.

FIG. 11 shows the first and second OLEDs D1 and D2 and the second and third banks 364 and 366 of the bank layer 360. Since elements between the first substrate 310 and the planarization layer 350 and elements between the OLED D and the second substrate 380 have been described, illustration and description thereof are omitted.

As shown in FIG. 11, in the organic light emitting display device of the present disclosure, the first OLED D1 and the second OLED D2 are horizontally disposed so that the OLED D in the organic light emitting display device has a horizontal tandem structure.

The first OLED D1 is positioned in the first region P-1 surrounded by the first to third banks 362, 364 and 366, and the second OLED D2 is positioned in the second region P-2 surrounded by the first to third banks 362, 364 and 366. The first and second OLEDs D1 and D2 are disposed on the planarization layer 350.

The first OLED D1 includes the first electrode 410 as an anode and the first organic light emitting layer 430, and the first organic light emitting layer 430 includes a first EML 436 on the first electrode 410, a first hole auxiliary layer between the first electrode 410 and the first EML 436 and an n-type CGL 438 on the first EML 436. The first hole auxiliary layer may include a first hole injection layer (HIL) 432 and a first hole transporting layer (HTL) 434. In addition, the first organic light emitting layer 430 may further include a first electron auxiliary layer between the first EML 436 and the n-type CGL 438.

The second OLED D2 includes the second electrode 420 as a cathode and a second organic light emitting layer 440, and the second organic light emitting layer 440 includes a second EML 444 on the second electrode 420, a second electron auxiliary layer 442 between the second electrode 420 and the second EML 444 and a second hole auxiliary layer on the second EML 444. The second hole auxiliary layer may include a second HIL 448 and a second HTL 446. The second electron auxiliary layer may be an electron transporting layer (ETL), and the second organic light emitting layer 440 may further include an electron injection layer (EIL) between the second electrode 420 and the second electron auxiliary layer 442.

The p-type CGL 450 is formed on the n-type CGL 438 in the first region P-1 and the second hole auxiliary layer 448 in the second region P-2.

The OLED in FIG. 11 and the OLED in FIG. 6 have a difference in the first and second electrodes 410 and 420.

The first electrode 410 may include a first transparent conductive oxide material layer 412, a second transparent conductive oxide material layer 416 under the first transparent conductive oxide material layer 412 and a reflective layer 414 between the first and second transparent conductive oxide material layers 412 and 416. For example, each of the first and second transparent conductive oxide material layers 412 and 416 may be formed of ITO, and the reflective layer may be formed of Ag or Al. The first electrode 410 may have a triple-layered structure.

The second electrode 420 may include a reflective layer 424 and a transparent conductive oxide material layer 426 under the reflective layer 424. For example, the transparent conductive oxide material layer 426 may be formed of ITO, and the reflective layer 424 may be formed of Ag or Al. The second electrode 420 may have a double-layered structure.

Namely, each of the first and second electrodes 410 and 420 is a reflective electrode, and the first and second electrodes 410 and 420 are disposed at the same layer. However, a top surface of the first electrode 210 is the first transparent conductive oxide material layer 412 having a relative high work function value, and a top surface of the second electrode 220 is the reflective layer 424 having a relative low work function value.

Alternatively, the first electrode 410 may have a double-layered structure including the transparent conductive oxide material layer 412 and the reflective layer 414, and the second electrode 420 may have a single-layered structure of the reflective layer 424.

The first and second electrodes 410 and 420 may be formed by a half-tone mask process using a half-tone mask.

For example, the half-tone mask process may be performed as below.

After a first transparent conductive oxide layer, a reflective material layer, a second transparent conductive oxide layer and a photo-resist (PR) layer are sequentially formed, a half-tone mask including a blocking part, which corresponds to the first region P-1, a half-transmissive part, which corresponds to the second region P-2, and a transmissive part, which corresponds to other regions except the first and second regions P-1 and P-2, is disposed over the PR layer.

Next, by performing an exposing step, a developing step and an etching step to the PR layer, a first PR pattern corresponding to the first region P-1 and having a first thickness and a second PR pattern corresponding to the second region P-2 and having a second thickness, which is smaller than the first thickness, are formed.

Next, the first transparent conductive oxide layer, the reflective material layer and the second transparent conductive oxide layer are etched using the first and second PR patterns as an etching mask.

Next, by performing an ashing step to the first and second PR patterns, a thickness of the first PR pattern is reduced, and the second PR pattern is removed.

Next, by removing the second transparent conductive oxide layer in the second region P-2 and exposing the reflective material layer in the second region P-2 using the first PR pattern as a blocking mask, the first electrode 410, which has a triple-layered structure of the first transparent conductive oxide material layer 412, the reflective layer 414 and the second transparent conductive oxide material layer 416, and the second electrode 420, which has a double-layered structure of the transparent conductive oxide material layer 426 and the reflective layer 424, are respectively formed in the first and second regions P-1 and P-2.

In FIGS. 1 to 11, the first organic light emitting layer including the n-type CGL is formed on the first electrode as an anode, and the p-type CGL is formed in the first and second regions. As a result, the first and second OLEDs share the p-type CGL.

Alternatively, the second organic light emitting layer including the p-type CGL may be formed on the second electrode as a cathode, and the n-type CGL may be formed in the first and second regions. As a result, the first and second OLEDs share the n-type CGL.

For example, a first organic light emitting layer including a first hole auxiliary layer, which includes at least one of an HIL and an HTL, a first EML and a first electron auxiliary layer, e.g., a first ETL, may be formed on the first electrode in the first region, and a second organic light emitting layer including a second electron auxiliary layer, which includes at least one of an EIL and an ETL, a second EML, a second hole auxiliary layer, which includes at least one of an HIL and an HTL, and a p-type CGL may be formed on the second electrode in the second region. An n-type CGL may be formed on the first and second organic light emitting layers in the first and second regions. In this case, the first electron auxiliary layer in the first region may contact the n-type CGL, and the p-type CGL in the second region may contact the n-type CGL.

It will be apparent to those skilled in the art that various modifications and variations can be made in the embodiments of the present disclosure without departing from the spirit or scope of the present disclosure. Thus, it is intended that the modifications and variations cover this disclosure provided they come within the scope of the appended claims and their equivalents.

What is claimed is:

1. An organic light emitting display device, comprising:
a first substrate including a first pixel, the first pixel including a first region and a second region;
a first electrode in the first region and on the first substrate, the first electrode having a first work function value;
a second electrode in the second region and on the first substrate, the second electrode having a second work function value that is less than the first work function value;
a first organic light emitting layer on the first electrode;
a second organic light emitting layer on the second electrode; and
a p-type charge generation layer in the first region and the second region, the p-type charge generation layer on the first organic light emitting layer and the second organic light emitting layer.

2. The organic light emitting display device according to claim 1, wherein the first organic light emitting layer includes:
a first emitting material layer;
a first hole auxiliary layer between the first electrode and the first emitting material layer;
a first electron auxiliary layer between the first emitting material layer and the p-type charge generation layer; and
an n-type charge generation layer between the first electron auxiliary layer and the p-type charge generation layer; and
wherein the second organic light emitting layer includes:
a second emitting material layer;
a second electron auxiliary layer between the second electrode and the second emitting material layer; and

a second hole auxiliary layer between the second emitting material layer and the p-type charge generation layer.

3. The organic light emitting display device according to claim 2, wherein a distance between the second electrode and the second emitting material layer is less than a distance between the first electrode and the first emitting material layer.

4. The organic light emitting display device according to claim 3, wherein an area of the second region is greater than an area of the first region.

5. The organic light emitting display device according to claim 1, further comprising:
a first bank extending along a first direction, the first bank at a first edge of the first pixel;
a second bank extending along a second direction, the second bank at a second edge of the first pixel; and
a third bank extending along the second direction, the third bank between the first region and the second region,
wherein the first direction and the second direction cross each other.

6. The organic light emitting display device according to claim 5, wherein the first bank has a first width, and the second bank has a second width, and
wherein the third bank has a third width that is less than each of the first width and the second width.

7. The organic light emitting display device according to claim 6, wherein the first substrate further includes a second pixel adjacent to the first pixel in the first direction,
wherein the p-type charge generation layer extends into the second pixel.

8. The organic light emitting display device according to claim 5, wherein a distance between the second bank and the third bank in the first region is equal to a distance between the second bank and the third bank in the second region.

9. The organic light emitting display device according to claim 5, wherein a distance between the second bank and the third bank in the first region is different from a distance between the second bank and the third bank in the second region.

10. The organic light emitting display device according to claim 5, wherein a thickness of the first bank is less than a thickness of each of the second bank and the third bank.

11. The organic light emitting display device according to claim 1, wherein the p-type charge generation layer has an island shape in the first pixel.

12. The organic light emitting display device according to claim 1, wherein the first organic light emitting layer provides a light having a first wavelength range, and the second organic light emitting layer provides a light having a second wavelength range, and
wherein the first wavelength range is same as the second wavelength range.

13. The organic light emitting display device according to claim 1, wherein the first organic light emitting layer provides a light having a first wavelength range, and the second organic light emitting layer provides a light having a second wavelength range, and
wherein the first wavelength range is different from the second wavelength range.

14. The organic light emitting display device according to claim 1, further comprising:
a driving element connected to the first electrode;
a high potential voltage line connected to the driving element; and a low potential voltage line connected to the second electrode.

15. The organic light emitting display device according to claim 1, wherein each of the first organic light emitting layer and the second organic light emitting layer are formed by a solution process, and the p-type charge generation layer is formed by a deposition process.

16. The organic light emitting display device according to claim 1, wherein the p-type charge generation layer includes an organic material and a p-type dopant.

17. The organic light emitting display device according to claim 1, wherein the first electrode is an anode, and the second electrode is a cathode.

18. The organic light emitting display device according to claim 17, wherein the first electrode includes a first reflective layer and a first transparent conductive oxide material layer on the first reflective layer, and the second electrode includes a second reflective layer, and wherein the second reflective layer comprises a same material as the first reflective layer, the second reflective layer and the first reflective layer on a same layer.

19. The organic light emitting display device according to claim 18, wherein the first electrode further includes a second transparent conductive oxide material layer under the first reflective layer, and the second electrode further includes a third transparent conductive oxide material layer under the second reflective layer, and wherein the third transparent conductive oxide material layer comprises a same material as the second transparent conductive oxide material layer, the third transparent conductive oxide material layer and the second transparent conductive oxide material layer on a same layer.

20. The organic light emitting display device according to claim 1, further comprising:

an organic material layer on the p-type charge generation layer; and a second substrate on the organic material layer.

* * * * *